(12) United States Patent
Miyanishi et al.

(10) Patent No.: US 11,657,983 B2
(45) Date of Patent: May 23, 2023

(54) SOLAR BATTERY CELL, SOLAR BATTERY, SOLAR BATTERY MODULE, AND SOLAR BATTERY ARRAY

(71) Applicant: SHARP KABUSHIKI KAISHA, Sakai (JP)

(72) Inventors: Shintaro Miyanishi, Sakai (JP); Hiroshi Sugimura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 19 days.

(21) Appl. No.: 17/402,996

(22) Filed: Aug. 16, 2021

(65) Prior Publication Data

US 2022/0059295 A1 Feb. 24, 2022

(30) Foreign Application Priority Data

Aug. 19, 2020 (JP) .............................. JP2020-138791

(51) Int. Cl.
*H01G 9/20* (2006.01)
*H10K 30/10* (2023.01)

(52) U.S. Cl.
CPC .......... *H01G 9/2081* (2013.01); *H01G 9/2077* (2013.01); *H10K 30/10* (2023.02)

(58) Field of Classification Search
CPC .... H01G 9/2081; H01G 9/2077; H01L 31/05; H01L 31/048; H01L 31/046; H01L 31/0445; H10K 30/10
See application file for complete search history.

(56) References Cited

U.S. PATENT DOCUMENTS

2015/0349702 A1* 12/2015 Morad ................ H01L 31/048
136/251
2018/0366657 A1 12/2018 Wakamiya et al.

FOREIGN PATENT DOCUMENTS

| JP | 2011-216877 A | 10/2011 |
| JP | 2020-048382 A | 3/2020 |
| WO | 2017/104792 A1 | 6/2017 |
| WO | WO-2019181940 A1 * | 9/2019 |

OTHER PUBLICATIONS

Aita, WO2019/181940 A1, Machine Translation (Year: 2019).*
Seo, Perovskite Solar Cells with Inorganic Electron-and Hole-Transport Layers Exhibiting Long-Term (≈500 h) Stability at 85° C. under Continuous 1 Sun Illumination in Ambient Air, Adv. Mater. 2018, 30, 1801010, pp. 1-8 (Year: 2018).*
Zhang, Barrier Designs in Perovskite Solar Cells for Long-Term Stability, Adv. Energy Mater. 2020, 10, 2001610, pp. 1-49 (Year: 2020).*

* cited by examiner

*Primary Examiner* — Devina Pillay
(74) *Attorney, Agent, or Firm* — ScienBiziP, P.C.

(57) ABSTRACT

A solar battery cell, comprises a substrate; a first electrode provided on the substrate; a photoelectric conversion layer provided on the first electrode; a second electrode provided on the photoelectric conversion layer; and a barrier layer so provided as to cover a side portion of the photoelectric conversion layer, wherein the photoelectric conversion layer has an electron transport layer, a light absorption layer provided on the electron transport layer, and a hole transport layer provided on the light absorption layer, the light absorption layer includes a compound having a perovskite crystal structure, and the barrier layer is a dense inorganic material layer.

9 Claims, 8 Drawing Sheets

SOLAR BATTERY CELL, SOLAR BATTERY, SOLAR BATTERY MODULE, AND SOLAR BATTERY ARRAY

BACKGROUND OF THE INVENTION

Cross-Reference to Related Application

The present application claims priority from Japanese Application JP2020-138791, the content of which is hereby incorporated by reference into this application.

BACKGROUND

1. Field

One aspect of the present invention relates to a solar battery cell, a solar battery, a solar battery module, and a solar battery array.

Background Art

A photoelectric conversion element is used for various optical sensors, solar batteries, etc. In particular, development of photoelectric conversion elements with a stack of a charge generation layer (light absorption layer) and a charge transfer layer has become popular, in terms of high photoelectric conversion efficiency and manufacturing cost. In recent years, a perovskite solar battery using a charge generation layer containing a compound having an organic-inorganic perovskite crystal structure has attracted attention because of achieving a photoelectric conversion efficiency comparable to that of a solar battery using an inorganic material (see, for example, specification of WO2017/104792A1). Further, in this perovskite solar battery, the charge generation layer is formed on the surface of mesoporous $TiO_2$ thereby to improve the photoelectric conversion efficiency. The mesoporous $TiO_2$ functions as a scaffold of the charge generation layer and also as an electron transport layer. These charge generation layers can be manufactured by a coating process without using a vacuum process, and thereby can significantly reduce the manufacturing cost of solar batteries. A perovskite solar battery, which is promising in terms of conversion efficiency and cost, and a perovskite solar battery module, which integrates a plurality of perovskite solar batteries, are expected as key devices for an independent power supply system for mobile devices including IoT and electric vehicles.

Further, when a part of a series-connected solar battery cells becomes a shadow, a heat generation called a hot spot phenomenon may occur. A solar battery module having a bypass diode so as to suppress this hot spot phenomenon is known (see, for example, Japanese Unexamined Patent Application Publication No. 2020-048382). Further, a varistor is also used so as to protect an electronic component, such as IC (integrated circuit) and LSI (large-scale integration) semiconductor devices, from an overvoltage such as an electrostatic discharge (see, for example, Japanese Unexamined Patent Application Publication No. 2011-216877).

SUMMARY

In the conventional perovskite solar battery, moisture penetrates into the charge generation layer under a high temperature and high humidity condition, and deteriorates the perovskite solar battery. One aspect of the present invention has been made in view of such circumstances, and provides a solar battery cell capable of suppressing deterioration caused by moisture.

One aspect of the present invention provides a solar battery cell, including: a substrate; a first electrode provided on the substrate; a photoelectric conversion layer provided on the first electrode; a second electrode provided on the photoelectric conversion layer; and a barrier layer so provided as to cover a side portion of the photoelectric conversion layer, wherein the photoelectric conversion layer has an electron transport layer, a light absorption layer provided on the electron transport layer, and a hole transport layer provided on the light absorption layer, and the light absorption layer includes a compound having a perovskite crystal structure, and the barrier layer is a dense inorganic material layer.

A solar battery cell of one aspect of the present invention includes a barrier layer so provided as to cover a side portion of the photoelectric conversion layer, wherein the barrier layer is a dense inorganic material layer. With this, it is possible to suppress moisture from entering the light absorption layer from the side portion of the photoelectric conversion layer and to suppress the solar battery cell from deteriorating. Further, since the barrier layer is the dense inorganic material layer, the barrier function of the barrier layer can be suppressed from being reduced by ultraviolet rays, temperature changes, and the like.

BRIEF DESCRIPTION OF THE DRAWINGS

FIG. 4A to FIG. 4C illustrate a manufacturing method of the series-connected solar batteries.

DESCRIPTION OF EMBODIMENTS

A solar battery cell of one aspect of the present invention, includes: a substrate; a first electrode provided on the substrate; a photoelectric conversion layer provided on the first electrode; a second electrode provided on the photoelectric conversion layer; and a barrier layer so provided as to cover a side portion of the photoelectric conversion layer, wherein the photoelectric conversion layer has an electron transport layer, a light absorption layer provided on the electron transport layer, and a hole transport layer provided on the light absorption layer, and the light absorption layer includes a compound having a perovskite crystal structure, and the barrier layer is a dense inorganic material layer.

Preferably, the barrier layer includes a material that exhibits a varistor characteristic, and the barrier layer connects with the first electrode and the second electrode such that the barrier layer and the photoelectric conversion layer are connected in parallel. This allows the barrier layer to function as a bypass to protect the photoelectric conversion layer from a high voltage when the solar battery cell is in a shadow. Further, this barrier layer can suppress the power generation from being reduced due to the shadow. Further, retrofitting the bypass diode to the solar battery cell can be omitted, thus making it possible to reduce the manufacturing cost. Further, reliability of the solar battery cell is improved because the number of junction portions can be reduced. One aspect of the present invention also provides a series-connected solar battery, including: a plurality of the solar battery cells of one aspect of the present invention; a first terminal; and a second terminal. The plurality of the solar battery cells are connected in series, the solar battery cell at one end, among the plurality of the solar battery cells, is connected to the first terminal, and the solar battery cell at another end is connected to the second terminal. The series-connected solar battery of one aspect of the present invention can increase the terminal voltage.

One aspect of the present invention also provides a solar battery module having a plurality of series-connected solar batteries of one aspect of the present invention. A plurality of the first terminals are arranged on a light reception face, and a plurality of the second terminals are arranged on a back face on an opposite side of the light reception face. This makes it possible to separate a terminal polarity between the light reception face and the back face. With this, simply overlapping the two solar battery modules makes it possible to accomplish the series connection of the series-connected solar batteries included in one solar battery module and the series-connected solar batteries included in the other solar battery module. Preferably, the solar battery module is a rectangle, each of the plurality of the series-connected solar batteries has an elongated shape, each of the plurality of the first terminals is arranged at one end of the elongated shape, each of the plurality of the second terminals is arranged at another end of the elongated shape, and the plurality of the series-connected solar batteries are arranged in parallel rows in a manner to be diagonal to one side of the rectangle. This allows the first terminal of one of the two adjacent series-connected solar batteries and the second terminal of the other series-connected solar battery to be connected by means of the bus bar which is arranged parallel to one side of the rectangular solar battery module. With this, the two adjacent series-connected solar batteries can be connected in series.

Preferably, the solar battery module of one aspect of the present invention, further includes a bus bar, wherein, preferably, the bus bar electrically connects two of the series-connected solar batteries which are included in the plurality of the series-connected solar batteries and are adjacent to each other. Preferably, the plurality of the first terminals included in the solar battery module are lined up in a row, and the plurality of the second terminals included in the solar battery module are lined up in a row. This facilitates the connection of the two solar battery modules, the connection of the first terminal with the second terminal, or the connection of the first terminal or the second terminal with the bus bar. Further, the number of series-connected solar batteries to be connected in parallel can be easily adjusted, a high voltage can be suppressed when the solar battery module is connected, and the current value can be increased. One aspect of the present invention also provides a solar battery array, including: a plurality of the solar battery modules of one aspect of the present invention. The plurality of the solar battery modules include a first solar battery module and a second solar battery module, and the plurality of the first terminals and the plurality of the second terminals included in the first solar battery module are arranged at a position that is mirror-image symmetrical with a position of the plurality of the first terminals and the plurality of the second terminals included in the second solar battery module. Overlapping the first solar battery module with the second solar battery module can easily bring the first terminal of the first solar battery module and the second terminal of the second solar battery module into contact with each other, and can accomplish a series connection of the series-connected solar battery included in the first solar battery module and the series-connected solar battery included in the second solar battery module.

Hereinafter, one aspect of the present invention will be described in more detail with reference to a plurality of embodiments. The configurations shown in the drawings and in the following description are exemplary, and the scope of one aspect of the present invention is not limited to those shown in the drawings and in the following description.

First Embodiment

A first embodiment relates to a solar battery cell and a series-connected solar battery. FIG. 1 to FIG. 4 are drawings relating to a solar battery cell and a series-connected solar battery of the present embodiment. A solar battery cell 20 (20a to 20e) of the present embodiment is provided with a first substrate 2, a first electrode 3 (3a to 3e) provided on the first substrate 2, a photoelectric conversion layer 4 (4a to 4e) provided on the first electrode 3, a second electrode 8 (8a to 8e) provided on the photoelectric conversion layer 4, and a first barrier layer 9 provided to cover a side portion of the photoelectric conversion layer 4. The photoelectric conversion layer 4 has an electron transport layer 5 (5a to 5e), a light absorption layer 6 (6a to 6e) provided on the electron transport layer 5, and a hole transport layer 7 (7a to 7e) provided on the light absorption layer 6. The light absorption layer 6 includes a compound having a perovskite crystal structure, and the first barrier layer 9 is characterized in being a dense inorganic material layer.

A series-connected solar battery 25 of the present embodiment has a plurality of solar battery cells 20 (20a to 20e), a first terminal 15, and a second terminal 16, wherein the plurality of solar battery cells 20 are connected in series, and the solar battery cell 20a at one end, among the plurality of series-connected solar battery cells 20, is connected to the first terminal 15, and the solar battery cell 20e at the other end is connected to the second terminal 16. The series-connected solar battery 25 may be a solar battery module 30. The number of solar battery cells 20 to be connected in series is not particularly limited as long as being plural.

The first substrate 2 is a substrate for forming the photoelectric conversion layer 4. The first substrate 2 may be a substrate for the series-connected solar battery 25 or a substrate for the solar battery module 30. When the solar battery module 30 has a plurality of series-connected solar batteries 25, the plurality of series-connected solar batteries 25 may be provided on the single first substrate 2. When the first substrate 2 is on a light incident side, the first substrate 2 is composed of a translucent material. The first substrate 2 may be a glass substrate or a transparent organic film. This allows light to enter an interior of the solar battery cell 20. When the first substrate 2 is a flexible organic film, the solar battery module 30 is a flexible solar battery module.

Examples of the materials of the organic film that serves as the first substrate 2 specifically include polyethylene terephthalate (PET), polybutylene terephthalate (PBT), polyphenylene sulfide (PPS), polyetherimide (PEI), polytetrafluoroethylene (PTFE), polyamideimide (PAD, polyethylene naphthalate (PEN), and the like, but any other resin can also be used as long as meeting the requirement. A film thickness of 50 to 100 µm is desirable for the organic film that serves as the first substrate 2.

If the first substrate 2 is a transparent organic film, a second barrier layer 10 may be provided on one main face of the first substrate 2. The second barrier layer 10 is a layer of a material with a high gas barrier property. This suppresses the interior of the solar battery cell 20 (20a to 20e) from deteriorating due to the moisture and oxygen in the air. Further, the second barrier layer 10 is a layer of an insulator material. This can suppress any leakage current from flowing. The film thickness of the second barrier layer 10 can be several tens to 100 nm. This allows the second barrier layer 10 to have a light permeability. Further, the solar battery cell 20 can be flexible. Examples of the materials of the second barrier layer 10 specifically include silicon oxide, aluminum oxide, and the like. Any other oxidized substance and insulator can also be used as the material for the second barrier layer 10, as long as the second barrier layer 10 has the gas barrier property, insulating property, and light permeability. Examples of the main film forming methods for the second barrier layer 10 include a sputter deposition method, a vacuum deposition method, and the like.

The first electrode 3 (3a to 3e) is provided on the first substrate 2 (or on the second barrier layer 10) and is an electrode for extracting a current generated by a photovoltaic force of the photoelectric conversion layer 4 of the solar battery cell 20 (20a to 20e). When the first substrate 2 is on the light incident side, the first electrode 3 can be a transparent conductive film. The transparent conductive film is composed of conductive transparent materials such as, for example, aluminum doped zinc oxide (AZO), indium zinc oxide (IZO), gallium doped zinc oxide (GZO), fluorine doped tin oxide (FTO), indium tin oxide (ITO), and the like. Further, the first electrode 3 may include fine lines of a conductive metal such as silver patterned on an oxide such as the above-described conductive transparent material. It is preferable that the sheet resistance of the first electrode 3 is 10 Ω/sq or less, and that the light transmittance of the first electrode 3 is 80% or more. The formation method of the first electrode 3 includes a sputter deposition method, a vacuum deposition method, a conductive paste coating/printing technology, a low-temperature firing technology, and the like.

When a plurality of solar battery cells 20 are provided on the first substrate 2, the transparent conductive film formed on the first substrate 2 is divided for each solar battery cell 20. For example, since the series-connected solar battery 25 shown in FIG. 1 includes five solar battery cells 20a to 20e, the transparent conductive film is divided and five first electrodes 3a to 3e are formed. A groove dividing the two adjacent first electrodes 3 may be filled with the light absorption layer 6 or the like.

The first terminal 15 of the series-connected solar battery 25 is formed on the organic film that is the first substrate 2, and a part of the first terminal 15 penetrates through the organic film (the first substrate 2) and the second barrier layer 10 and contacts or is electrically connected to the first electrode 3a of the solar battery cell 20a at the end of the series-connected solar battery cells 20a to 20e. This first terminal 15 can be used to extract the current generated by the photovoltaic force of the series-connected solar batteries 25. Examples of the material of the first terminal 15 include SnZn-base solder paste. Any other conductive paste and electrode material can be used as long as meeting the requirement.

The photoelectric conversion layer 4 (4a to 4e) is a layer in which light energy is converted into electrical energy. Specifically, photovoltaic power is generated when the photoelectric conversion layer 4 receives light. The photoelectric conversion layer 4 is provided on the first electrode 3 (3a to 3e). The photoelectric conversion layer 4 has the electron transport layer 5 (5a to 5e), the light absorption layer 6 (6a to 6e) provided on the electron transport layer 5, and the hole transport layer 7 (7a to 7e) provided on the light absorption layer 6.

The electron transport layer 5 is a layer that transports, to the first electrode 3, electrons generated by photo-excitation in the light absorption layer 6. Accordingly, the electron transport layer 5 is made of a material with which electrons generated in the light absorption layer 6 can be readily transferred to the electron transport layer 5, and electrons in the electron transport layer 5 can be readily transferred to the first electrode 3. Further, the electron transport layer 5 may also be a seed layer for oriented growth of the light absorption layer 6. This can improve the crystal quality of the compound having the perovskite crystal structure that constitutes the light absorption layer 6. The electron transport layer 5 is, for example, a titanium oxide ($TiO_2$) layer. Further, a TiN layer or a $TiO_2$-xNx layer may also be formed on the surface of the titanium oxide contained in this titanium oxide layer. The film thickness of the electron transport layer 5 is, for example, 100 nm or more and 250 nm or less.

For example, as a seed layer that serves as the electron transport layer 5, the titanium oxide ($TiO_2$) layer can be formed, with a film thickness of 100 to 250 nm, on the transparent conductive film that serves as the first electrode 3. The formation method of the above-described seed layer includes a sputter deposition method, a vacuum deposition method, a conductive paste coating/printing technology and a low-temperature firing technology, or the like. For example, the seed layer may be formed by coating the low-temperature firing titanium oxide ($TiO_2$) paste on a transparent conductive film and a firing at 150° C. or lower. The crystal structure of the $TiO_2$ contained in the $TiO_2$ layer is preferably a rutile structure. Further, a TiN (NaCl structure) layer with a film thickness of 5 to 30 nm may be formed on the surface of the $TiO_2$ by surface modification treatment with nitrogen plasma.

The lattice constant matching between $TiO_2$ (rutile structure) and TiN (NaCl structure) is relatively good, and a good interface with few defects is formed between the $TiO_2$ layer composed of $TiO_2$ and the TiN layer composed of TiN. The formation of the mixed-crystal material $TiO_2$-xNx near the interface causes a continuous change in the lattice constant, and the generation of an interface defect can be suppressed. When the TiN layer is exposed to the atmosphere after the surface modification treatment by the nitrogen plasma, an oxidation layer with a thickness of several nm is formed on the surface, but because the formed $TiO_2$ layer is thin, any structural relaxation of the lattice constant does not occur and the lattice constant of the underlying TiN layer is maintained.

Figure 4A:
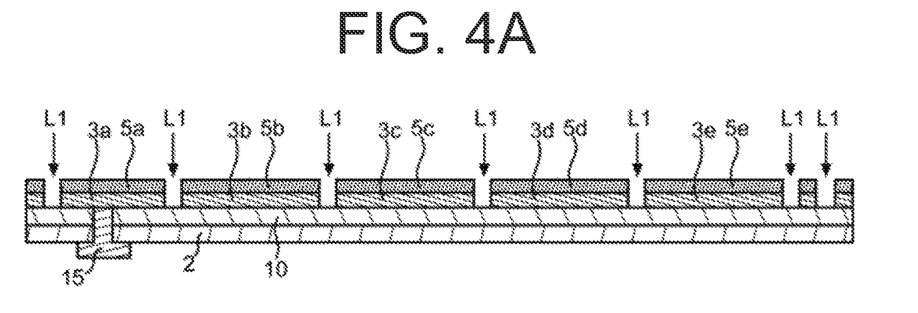

After the transparent conductive film (first electrode 3) and the seed layer (electron transport layer 5) are formed on the organic film (first substrate 2) coated with the second barrier layer 10, in order to separately form the solar battery cells 20a to 20e on the organic film (first substrate 2), laser scribing is used to form an incision (L1) into the transparent conductive film and the seed layer. As for the wavelength of the used laser, one in an infrared region is desirable. For example, as shown in FIG. 4A, the incision (L1) is formed in the transparent conductive film thereby to form the first electrodes 3a to 3e. No incision is formed in the second barrier layer 10.

The light absorption layer 6 (6a to 6e) is a layer that absorbs light incident on the photoelectric conversion layer 4 (4a to 4e) and generates electrons and holes. That is, in the light absorption layer 6, the electrons of lower energy in the materials constituting the light absorption layer 6 are photo-excited by the incident light, and the electrons of higher energy and the holes are generated. The above electrons move to the electron transport layer 5, and the holes move to the hole transport layer 7, resulting in charge separation.

The light absorption layer 6 includes a compound (organic-inorganic hybrid compound) having a perovskite crystal structure. Photo-exciting this compound can generate electrons and holes in the light absorption layer 6. The film thickness of the light absorption layer 6 is preferably in the range of 500 to 1000 nm.

For example, a compound having an organic-inorganic hybrid perovskite crystal structure (hereinafter referred to simply as a "perovskite structure compound") can be formed on the seed layer (electron transport layer 5) in which the incision (L1) is formed by the laser scribing, thus making it possible to form the light absorption layer 6. The perovskite structure compound has a tetragonal basic unit lattice. This unit lattice has an organic group (organic molecule) A arranged at each vertex, a metal atom B arranged at the body center, and a halogen atom X arranged at each face center, and is represented by a general formula $A-B-X_3$.

In the general formula $A-B-X_3$, specific examples of the organic group A (organic molecular alkylamine) include methylamine, ethylamine, propylamine, butylamine, pentylamine, hexylamine, dimethylamine, diethylamine, dipropylamine, dibutylamine, dipentylamine, dihexylamine, trimethylamine, triethylamine, tripropylamine, tributylamine, tripentylamine, trihexylamine, ethylmethylamine, methylpropylamine, butylmethylamine, methylpentylamine, hexylmethylamine, ethylpropylamine, ethylbutylamine, imidazole, azole, pyrrole, aziridine, azirine, azetidine, azetoazole, imidazoline, carbazole and their ions (e.g., methylammonium ($CH_3NH_3$), etc.) and phenethylammonium, etc. These organic groups may be used alone, or two or more of them may be used in combination. Among these, methylamine, ethylamine, propylamine, butylamine, pentylamine, hexylamine and their ions and phenethylammonium are preferable as the organic group A. Methylamine, ethylamine, propylamine and their ions (such as methylammonium ($CH_3NH_3$), etc.) are particularly preferred.

Further, in the general formula $A-B-X_3$, specific examples of the metal atom B include lead, tin, zinc, titanium, antimony, bismuth, nickel, iron, cobalt, silver, copper, gallium, germanium, magnesium, calcium, indium aluminum, manganese, chromium, molybdenum, europium, and the like. These elements may be used alone, or two or more may be used in combination. Among these, the properties of the photoelectric conversion layer 4 become more favorable with the metal atom B being lead.

Further, in the general formula $A-B-X_3$, specific examples of the halogen atom X include chlorine, bromine, and iodine. These elements may be used alone, or two or more may be used in combination. Among these, it is preferable that at least one of the halogen atoms X is iodine, since the energy band gap is narrowed.

It is preferable that the perovskite structure compound included in the light absorption layer 6 is a compound represented by $CH_3NH_3PbX_3$ (where X is a halogen atom), and it is more preferable that X is an iodine atom in the formula $CH_3NH_3PbX_3$ (i.e., a compound represented by $CH_3NH_3PbI_3$).

The compound having the perovskite structure used to form the light absorption layer 6 can be synthesized by using the compound indicated by AX and the compound indicated by $BX_2$ as raw materials. Specifically, compounds having the perovskite structure can be synthesized by mixing AX solution and $BX_2$ solution and heating and stirring (one-step method). Further, the compound having the perovskite structure can be synthesized by coating the $BX_2$ solution onto the seed layer (electron transport layer 5), for example, to form a coating film, and then coating the AX solution onto the coating film to react the $BX_2$ with the AX (two-step method). Both the one-step method and the two-step method can be used to form the light absorption layer 6 (the layer of the compound having the perovskite structure). The coating method is not particularly limited, and examples thereof include a screen printing method, an immersion coating method, an inkjet printing method, and the like.

Examples of organic solvents (contained in the coating solution) used for the coating method for forming the light absorption layer 6 include aromatic hydrocarbons such as toluene, xylene, mesitylene, tetralin, diphenylmethane, dimethoxybenzene, dichlorobenzene, and the like; halogenated hydrocarbons such as dichloromethane, dichloroethane, tetrachloropropane, and the like; ethers such as tetrahydrofuran (THF), dioxane, dibenzyl ether, dimethoxymethyl ether, 1,2-dimethoxyethane, and the like; ketones such as methyl ethyl ketone, cyclohexanone, acetophenone, isophorone, and the like; esters such as methyl benzoate, ethyl acetate, butyl acetate, and the like; sulfur-containing solvents such as diphenyl sulfide; fluorinated solvents such as hexafluoroisopropanol; aprotic polar solvents such as N,N-dimethylformamide, N,N-dimethylacetamide, dimethyl sulfoxide, and the like; alcohols such as methanol, ethanol, isopropanol, and the like; glyme solvents such as ethylene glycol, diethylene glycol monomethyl ether, and the like; and the like, which can be used alone or as mixed solvents. Water may be mixed in these solvents. Among these solvents, non-halogenated organic solvents are preferably used because of their consideration for the global environment. Further, apart from this, the coating liquid may also contain additives such as antioxidants, viscoelasticity modifiers, preservatives, curing catalysts, and the like.

When depositing the film of the perovskite structure compound to be the light absorption layer 6, the perovskite structure compound may become a needle-shaped crystal if the temperature of the first substrate 2 at the time of depositing the film is low. Preferably, the needle-shaped crystal is 10-20 μm in length and 1-5 μm in width, especially preferably in the form of a bamboo leaf. A space between the needle-shaped crystals may be coated with an organic binder resin as a filler. The organic binder resin needs to be transparent, and is preferably amorphous and a highly insulating material. Examples of organic binder resins include vinyl resins such as polymethyl methacrylate, polystyrene, polyvinyl chloride, and the like; thermoplastic resins such as polycarbonate, polyester, polyester carbonate, polysulfone, polyarylate, polyamide, methacrylic resin, acrylic resin, polyether, polyacrylamide, polyphenylene oxide, and the like; thermosetting resins such as epoxy resins, silicone resins, polyurethanes, phenol resins, alkyd resins, melamine resins, phenoxy resins, polyvinyl butyral, polyvinyl formals, and the like, partially crosslinked products of these resins, and copolymer resins containing two or more of the constituent units contained in these resins (insulating resins such as vinyl chloride-vinyl acetate copolymer resin, vinyl chloride-vinyl acetate-maleic anhydride copolymer resin, acrylonitrile-styrene copolymer resin, and the like), and the like. One type of these film-forming resins can be used alone, or two or more types of these resins can be used in combination; or any other resins can also be used as long as meeting the requirement.

The organic binder resin may also contain a hole transport material. Examples of the usable hole transport material include a pyrazoline compound, an arylamine compound, a stilbene compound, an enamine compound, a polypyrrole compound, a polyvinylcarbazole compound, a polysilane compound, a butadiene compound, a polysiloxane compound having aromatic amines in its side chain or main chain, a polyaniline compound, a polyphenylene vinylene compound, a polythienenevinylene compound, a polythiophene compound, and the like, with butadiene compound and bis-butadiene compound being particularly preferred, and also include conductive particles such as carbon nanofiber and the like, and conductive polymers such as PEDOT/PSS and the like. The hole transport material is preferably a compound that is difficult to crystallize, but may be configured to include an organic binder resin, a plasticizer or the like to reliably suppress crystallization of the hole transport material. Further, the organic solvent to be coated on the needle-shaped crystal is preferably a solvent that does not disturb the needle-shaped crystal. Specifically, chlorobenzene, toluene, and the like are suitable. The coating method is not particularly limited, and preferable examples thereof include the immersion coating method, the spray coating method, the slide hopper coating method, and the like.

Coating the surface of the needle-shaped crystal of the perovskite structure compound and the surface of the exposed seed layer (electron transport layer 5) with the above-described filler can prevent the current leakage between the first electrode 3 and the second electrode 8. Further, stiffness of the perovskite crystals is improved because the inter-needle-shaped crystals are solidified by the filler. Further, since the needle-shaped crystals are coated with the filler, the light incident on the photoelectric conversion layer 4 is multiply scattered, thereby increasing the absorption efficiency of light. T This increases the amount of carrier extraction amount (short circuit current) of the solar battery cell 20. Further, reducing the thickness of the photoelectric conversion layer 4 can also obtain a high open circuit voltage.

Figure 4B:
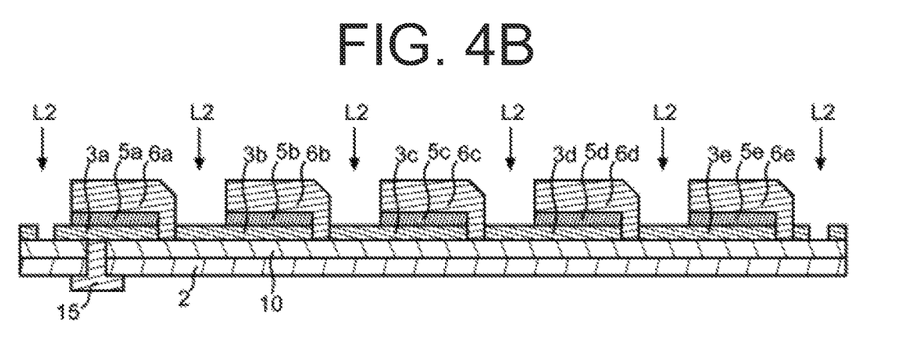

After the light absorption layer 6 is formed, an incision (L2) is formed in a portion of the light absorption layer 6 by the laser scribing in order to connect the first electrode 3 of one of the two adjacent solar battery cells 20 (20*a* to 20*e*) to the hole transport layer 7 and the second electrode 8 of the other solar battery cell 20. As for the wavelength of the laser to be used, one in the visible light region is desirable. For example, as shown in FIG. 4B, the incision (L2) is formed in the light absorption layer 6, and light absorption layers 6*a* to 6*e* are formed. This laser scribing removes a part of the light absorption layer 6 and a part of the electron transport layer 5, but does not remove the first electrode 3 and the second barrier layer 10.

The hole transport layer 7 (7*a* to 7*e*) is a layer that transports, to the second electrode 8, holes generated in the light absorption layer 6. The hole transport layer 7 is formed on the light absorption layers 6*a* to 6*e* which are divided by the laser scribing. The hole transport layer 7 includes, for example, an inorganic material having a band gap of 2 eV or more and an ionization potential greater than −5.3 eV (shallow). The thickness of the hole transport layer 7 is, for example, 30 nm or more and 100 nm or less. Specific materials constituting the hole transport layer 7 include oxides and sulfides such as copper oxide ($Cu_2O$) and zinc sulfide (ZnS).

The second electrode 8 (8*a* to 8*e*) is provided on the hole transport layer 7 and is an electrode for extracting the current generated by the photovoltaic force of the photoelectric conversion layer 4 of the solar battery cell 20 (20*a* to 20*e*). The second electrode 8 is, for example, a metal film having a work function of 5 eV or more. The second electrode 8 being composed of a metal with a deep work function (5 eV or higher) causes a bent band structure, which smoothens the flow of holes, to the interface between the hole transport layer 7 and the second electrode 8. The material of the second electrode 8 is, for example, a metal such as Ni, Pt, Pd, and the like. A film thickness of 50 nm to 150 nm is desirable for the second electrode 8. The hole transport layer 7 or the second electrode 8 can be formed by the sputter deposition method, the vacuum deposition method, or the like.

At the interface between the hole transport layer 7 and the light absorption layer 6, the holes generated in the light absorption layer 6 flow through the hole transport layer 7 to the second electrode 8, where the holes are extracted. As for electrons, the hole transport layer 7 blocks the flow of electrons to the second electrode 8, thus exerting an effect of deterring carrier recombination at the interface between the hole transport layer 7 and the light absorption layer 6.

Figure 4C:
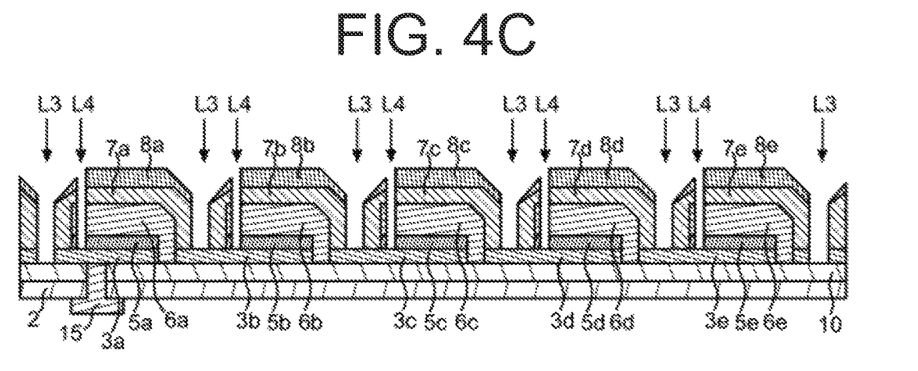

After the hole transport layer 7 and the second electrode 8 are formed, an incision (L3) is formed in a part of the hole transport layer 7 and the second electrode 8 by the laser scribing in order to form the hole transport layer 7 and the second electrode 8 into a series connection circuit of the adjacent solar battery cells 20*a* to 20*e* on the first substrate 2. Further, in order to make the after-described first barrier layer 9 function as a varistor 17, an incision (L4) is formed in the electron transport layer 5, the light absorption layer 6, the hole transport layer 7 and the second electrode 8. As for the wavelength of the used laser, one in an ultraviolet region is desirable. For example, as shown in FIG. 4C, the incisions (L3) are formed in the hole transport layer 7 and the second electrode 8, thus forming the hole transport layers 7*a* to 7*e* and the second electrodes 8*a* to 8*e*. Further, as shown in FIG. 4C, the incision (L4) to form the varistor 17 can be formed. Further, if the portion formed with the incision (L3) functions as the varistor 17, the incision (L4) can be omitted.

The first barrier layer 9 is a dense inorganic material layer (inorganic material having high density) and is provided in a manner to cover side portions of the photoelectric conversion layers 4 (4*a* to 4*e*). Further, the first barrier layer 9 can be provided so as to cover the entire periphery of the photoelectric conversion layer 4. Further, the first barrier layer 9 can be provided to cover the upper surface of the second electrode 8. This first barrier layer 9 can suppress moisture (such as water vapor) from entering the light absorption layer 6, thereby suppressing the solar battery cell 20 from deteriorating. Further, since the first barrier layer 9 is the dense inorganic material layer, the barrier function of the first barrier layer 9 can be suppressed from being deteriorated by ultraviolet rays, temperature changes, and the like. Further, the barrier property against water vapor can be improved by completely coating the photoelectric conversion layer 4 with the first barrier layer 9, the first electrode 3, the first substrate 2, the second barrier layer 10, and the like.

Further, the first barrier layer 9 may be composed of a material that exhibits a varistor characteristic. Further, the first barrier layer 9 can be so provided as to connect with the first electrode 3 and the second electrode 8 such that the first barrier layer 9 and the photoelectric conversion layer 4 are connected in parallel. The varistor characteristic is a voltage-current characteristic (current non-linearity) in which the current suddenly starts flowing at a certain voltage. The material that exhibits the varistor characteristic is not particularly limited as long as the material can be used for a varistor element. The thickness of the first barrier layer 9 can be, for example, 30 nm or more and 100 nm or less.

The first barrier layer 9 is formed on the second electrode 8 which was subjected to the laser scribing. Further, the first barrier layer 9 can be so formed as to fill the incision (L3). This allows the periphery and upper face of the photoelectric conversion layer 4 to be covered with the first barrier layer 9. Further, the first barrier layer 9 can be so formed as to fill the incision (L4). This allows the first barrier layer 9 to connect with the first electrode 3 and the second electrode 8 such that the first barrier layer 9 and the photoelectric conversion layer 4 are connected in parallel. Connecting a portion of the first barrier layer 9, as a varistor element structure, in parallel to the photoelectric conversion layer 4 can realize the solar battery cell 20 integrally provided with a bypass diode (varistor of the first barrier layer 9). This can, at a low cost, prevent the power generation efficiency from being reduced due to a shadow on the module.

The first barrier layer 9 can include, for example, zinc oxide (ZnO) as a base material (e.g., the content of zinc oxide in the first barrier layer 9 is 95 wt % or more), and silicon oxide, aluminum oxide, titanium oxide, and the like as additive materials. The varistor characteristics (I=KVα, K: device intrinsic constant, α: voltage nonlinear coefficient) of the first barrier layer 9 between the first electrode 3 and the second electrode 8 are preferably α=20 to 60 and the bending point voltage of preferably 2 V or more.

A second substrate 12 is a substrate arranged above the first barrier layer 9, and the photoelectric conversion layer 4 is positioned between the first substrate 2 and the second substrate 12. The second substrate 12 may be the substrate of the series-connected solar battery 25 or the substrate of the solar battery module 30. The second substrate 12 may be a glass substrate, a transparent organic film, or an opaque organic film.

When the second substrate 12 is the organic film, a third barrier layer 11 may be provided on one main face of the second substrate 12. The third barrier layer 11 is a layer of a material having a high gas barrier property. This suppresses the interior of the solar battery cell 20 (20*a* to 20*e*) from deteriorating due to the moisture and oxygen in the air. Further, the third barrier layer 11 is a layer of an insulator material. This can suppress any leakage current from flowing. The film thickness of the third barrier layer 11 can be several tens to 100 nm. Examples of the material of the third barrier layer 11 specifically include silicon oxide, aluminum oxide, and the like.

The second terminal 16 of the series-connected solar battery 25 is formed at the organic film as the second substrate 12, and a part of the second terminal 16 penetrates through the organic film (the second substrate 12) and the third barrier layer 11, and contacts the second electrode 8*e* of the solar battery cell 20*e* at the end of the series-connected solar battery cells 20*a* to 20*e* or is connected to the second electrode 8*e* through the first barrier layer 9. Using the first terminal 15 and the second terminal 16 can extract the current generated by the photovoltaic force of the series-connected solar batteries 25. The material of the second terminal 16 is SnZn-base solder paste. Any other conductive paste and electrode material can be used as long as meeting the requirement.

After the first barrier layer 9 is formed on the second electrode 8 or the like, the organic film (the second substrate 12) at which the second terminal 16 is formed is stretched together to the first barrier layer 9 via a laminate sheet 13, followed by laminating by heating, thereby completing the series-connected solar battery 25 or the solar battery module 30 in each of which a plurality of solar battery cells 20*a* to 20*e* are connected in series. Further, a hole is drilled at the laminate sheet 13 (sandwiched by the first barrier layer 9 and the second substrate 12)'s portion where the second terminal 16 is positioned. Therefore, the second terminal 16 and the first barrier layer 9 are well connected at the time of the laminating. This results in the formation of a varistor between the second electrode 8*e* and the second terminal 16. At the time of the power generation, a high voltage is applied to across the second electrode 8*e* and the second terminal 16, so the varistor characteristic thereof does not prevent the current from being extracted. Further, the second electrode 8*e* and the second terminal 16 may be in contact with each other. As the laminate sheet 13, a general laminating material may be used, and a resin film having a laminating temperature of 180° C. or less and high water resistance is desirable.

Figure 1:
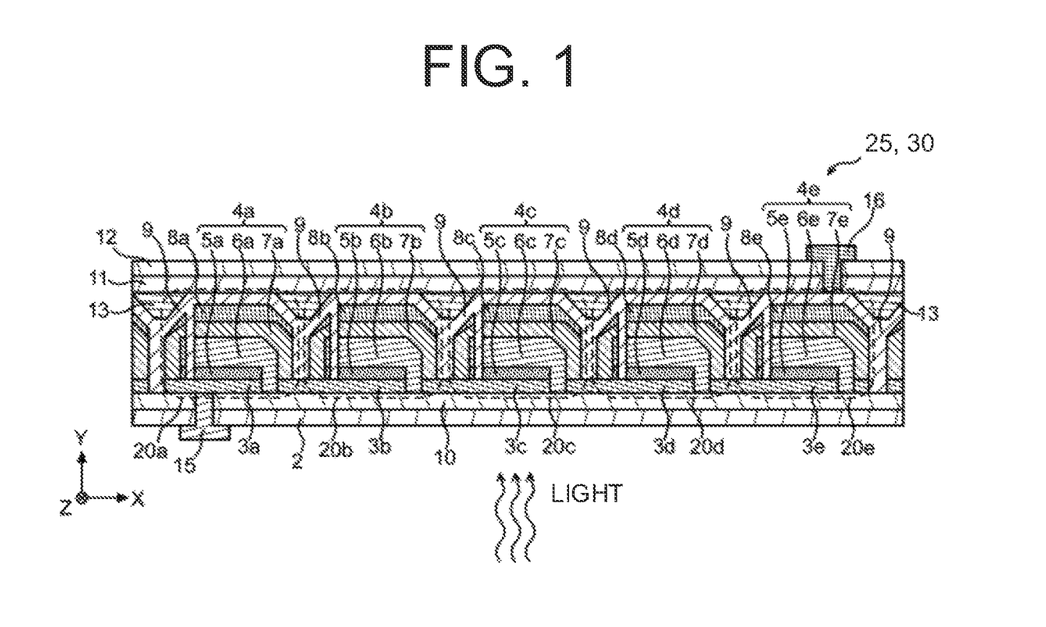
FIG. 1 is a schematic cross-sectional view of a series-connected solar battery of one embodiment of the present invention.
Figure 2:
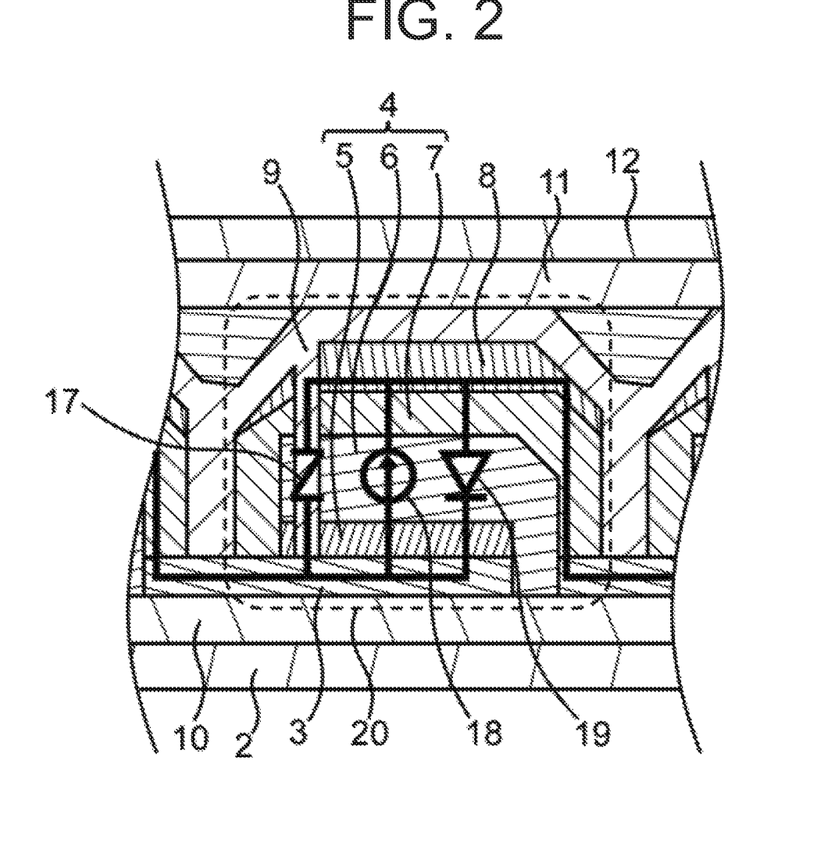
FIG. 2 is a partial cross-sectional view of the series-connected solar battery of one embodiment of the present invention.
Figure 3:
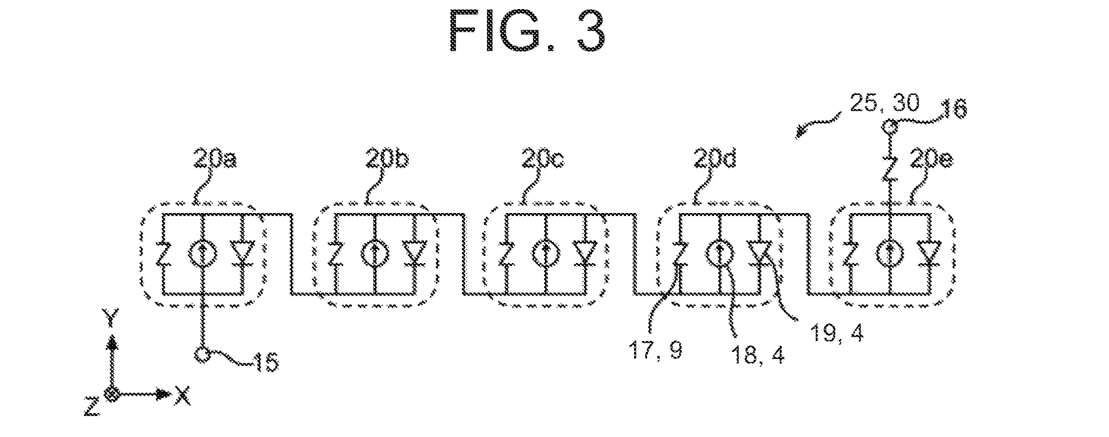
FIG. 3 is an equivalent circuit of the series-connected solar battery of one embodiment of the present invention.

FIG. 2 is a drawing of a schematic cross-sectional view of one solar battery cell 20 included in the series-connected solar battery 25, overlapped with an equivalent circuit of the solar battery cell 20, and FIG. 3 is an equivalent circuit of the series-connected solar battery 25 shown in FIG. 1. As shown in FIG. 2, the photoelectric conversion layer 4 can be represented by a current source 18 and a diode 19. Further, the first barrier layer 9 in the incision L4 is represented by the varistor 17, and the varistor 17 is connected to the first electrode 3 and the second electrode 8 in a manner to be connected in parallel with the photoelectric conversion layer 4.

Further, as shown in FIG. 3, in the series-connected solar battery 25, a plurality of solar battery cells 20 are connected in series. Further, among the plurality of series-connected solar battery cells 20*a* to 20*e*, the solar battery cell 20*a* arranged at one end is connected to the first terminal 15, and the solar battery cell 20*e* arranged at the other end is connected to the second terminal 16. When all of the solar battery cells 20*a* to 20*e* are receiving light and performing the photoelectric conversion, a current flowing in the arrow direction of the current source 18 is generated in all of the photoelectric conversion layers 4*a* to 4*e*. Then, the total voltage of the solar battery cells 20*a* to 20*e* can be output from the first terminal 15 and the second terminal 16.

For example, if the solar battery cell 20*c* is in the shadow and only the solar battery cell 20*c* is not performing the photoelectric conversion, no current is generated in the solar battery cell 20c. Further, in the solar battery cell 20c, the current does not easily flow in the opposite direction of the diode 19 (resistance is very high). Further, since the solar battery cells 20a, 20b, 20d, and 20e are performing the photoelectric conversion, a large voltage is applied to the solar battery cell 20c. When this voltage exceeds a predetermined voltage, the current flows sequentially from the first electrode 3c through the varistor 17 through the second electrode 8c to the first electrode 3d, and an excessive voltage to the solar battery cell 20c can be suppressed. That is, the varistor 17 functions as a bypass to protect the photoelectric conversion layer 4c from the high voltage. Further, this varistor 17 can suppress the power generation from being reduced due to shadows.

Second Embodiment

Figure 5:
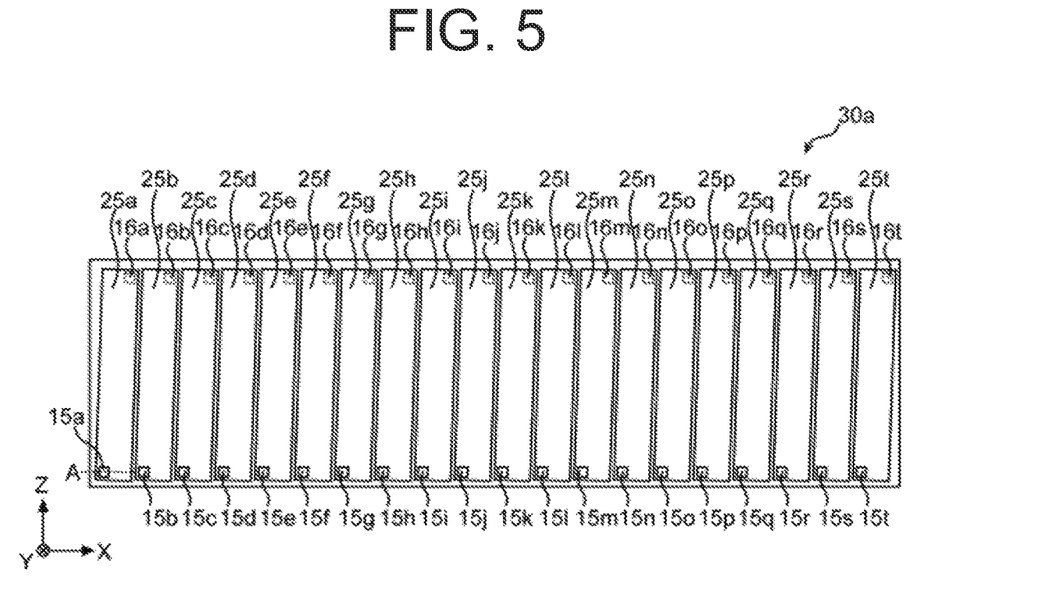
FIG. 5 is a schematic plan view of a solar battery module of one embodiment of the present invention.
Figure 6:
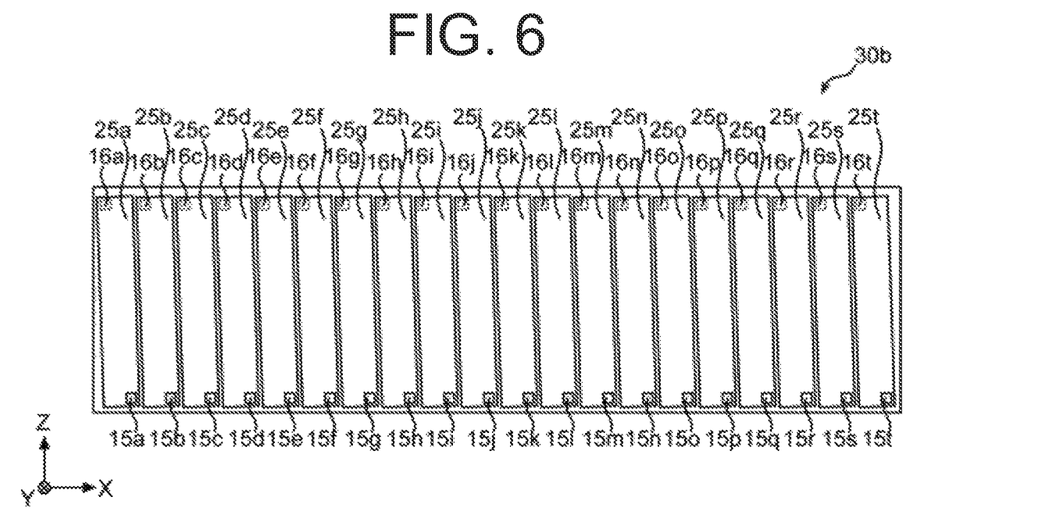
FIG. 6 is a schematic plan view of the solar battery module of one embodiment of the present invention.

A second embodiment relates to the solar battery module 30 and the solar battery array 40. FIG. 5 is a schematic plan view of an α-type solar battery module 30a of the present embodiment, and FIG. 6 is a schematic plan view of an ω-type solar battery module 30b of the present embodiment. The solar battery module 30 (30a, 30b) has a plurality of series-connected solar batteries 25 (25a to 25t). For example, the α-type solar battery module 30a shown in FIG. 5 and the ω-type solar battery module 30b shown in FIG. 6 each have 20 series-connected solar batteries 25a-25t. Each series-connected solar battery 25a to 25t has a cross-section as shown in FIG. 1. For example, the cross-section of the series-connected solar battery 25 at a dotted line A in FIG. 5 is like that shown in FIG. 1, excluding the second terminal 16 (16a). Further, a plurality of series-connected solar batteries 25 can be provided between one first substrate 2 and one second substrate 12. The solar battery module 30 may be a film-type perovskite solar battery module.

A long axis length and a short axis length of the solar battery cell 20 can be 300 mm and 10 mm, respectively, and a long axis length and a short axis length of the series-connected solar battery 25 in which the solar battery cells 20 are integrated in five series can be 300 mm and 50 mm, respectively. Further, 20 series-connected solar batteries 25 are lined up thereby to form the solar battery module 30 (30a, 30b). Although the short axis length of 10 mm is used herein as an example, the short axis length may be in the range of 5 mm to 15 mm. The size of the solar battery module 30 is only one example, and in the case of a small perovskite solar battery module for IoT, reducing the size of the solar battery module in a similar figure can maintain the voltage even if the area is reduced.

The plan views shown in FIGS. 5 and 6 are viewed from the light reception face side (first substrate 2 side) of the solar battery modules 30a and 30b, wherein first terminals 15a to 15t arranged on the light reception face side are shown in solid lines and second terminals 16a to 16t arranged on the back face are shown in dotted lines. Thus, arranging the first terminals 15a to 15t on the light reception face and arranging the second terminals 16a to 16t on the back face can separate a terminal polarity between the light reception face and the back face. With this, simply overlapping the two solar battery modules 30 makes it possible to accomplish the series connection of the series-connected solar batteries 25 included in one solar battery module 30 and the series-connected solar batteries 25 included in the other solar battery module 30. The first terminals 15a to 15t are lined up in a row along the lower end of the light reception face (first side extending in the longitudinal direction of the solar battery module 30). Further, the second terminals 16a to 16t are lined up in a row along the upper end of the back face (second side extending in the longitudinal direction of the solar battery module 30). This facilitates the connection of the two solar battery modules, the connection of the first terminal 15 with the second terminal 16, or the connection of the first terminal 15 or the second terminal 16 with the bus bar.

In the α-type solar battery module 30a shown in FIG. 5, the first terminals 15a to 15t are arranged at the lower left end portions of the light reception faces of the series-connected solar batteries 25a-25t, and the second terminals 16a to 16t are arranged at the upper right end portions of the back faces of the series-connected solar batteries 25a-25t. Further, in the ω-type solar battery module 30b shown in FIG. 6, the first terminals 15a to 15t are arranged at the lower right end portions of the light reception faces of the series-connected solar batteries 25a to 25t, and the second terminals 16a to 16t are arranged at the upper left end portions of the back faces of the series-connected solar batteries 25a to 25t. Accordingly, the arrangement of the first terminals 15a to 15t and the second terminals 16a to 16t in the α-type solar battery module 30a is mirror-image symmetrical with the arrangement of the first terminals 15a to 15t and the second terminals 16a to 16t in the ω-type solar battery module 30b. Overlapping the α-type solar battery module 30a with the ω-type solar battery module 30b can easily bring the first terminal 15 of the α-type solar battery module 30a and the second terminal 16 of the ω-type solar battery module 30b into contact with each other, and can accomplish the series connection of the series-connected solar battery 25 included in the α-type solar battery module 30a and the series-connected solar battery 25 included in the ω-type solar battery module 30b. Therefore, overlapping the front and back terminals of different types of solar battery modules, that is, the α-type and the ω-type, can easily accomplish the series connection, thus enabling an efficient connection.

Figure 7A:
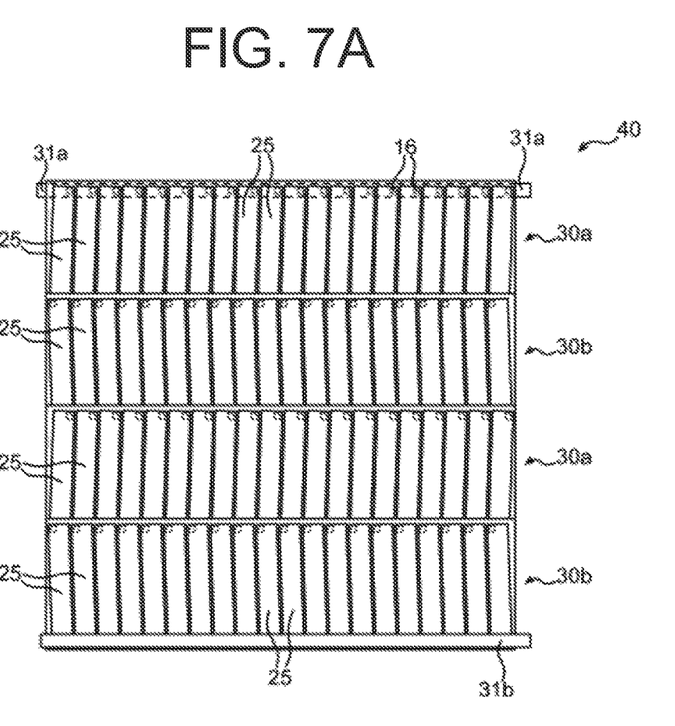
FIG. 7A is a schematic plan view of a solar battery array of one embodiment of the present invention.
Figure 7B:
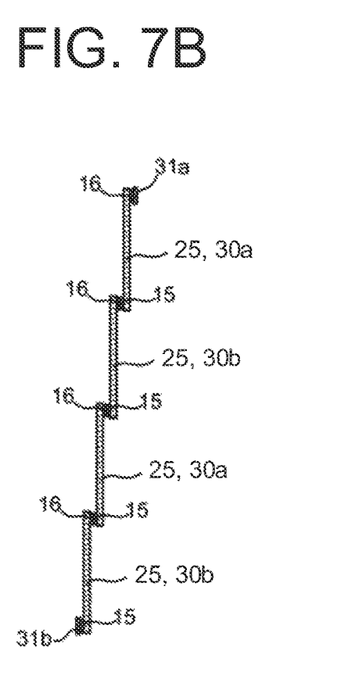
FIG. 7B is a schematic cross-sectional view of the solar battery array.
Figure 8:
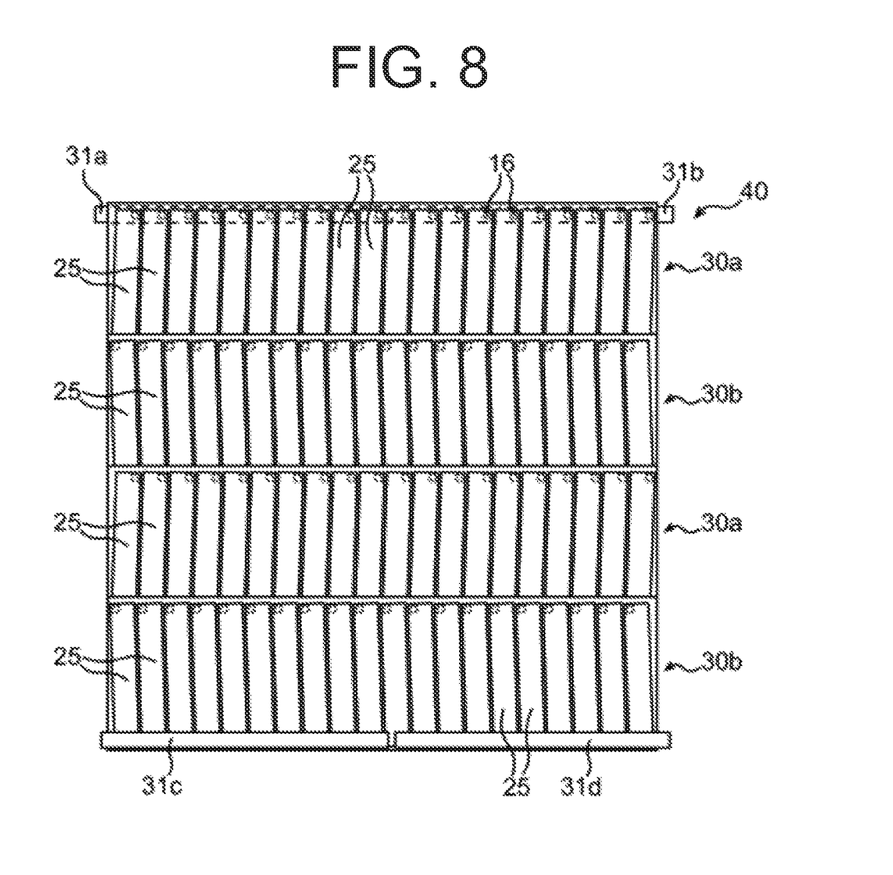
FIG. 8 is a schematic plan view of the solar battery array of one embodiment of the present invention.

FIG. 7A and FIG. 8 are schematic plan views of the solar battery array 40, respectively, and FIG. 7B is a schematic cross-sectional view of the solar battery array 40. With the α-type solar battery modules 30a and the ω-type solar battery modules 30b alternately connected, the solar battery array 40 has four connected solar battery modules 30. In these solar battery modules 30, as shown in FIG. 7B, the upper end of the ω-type solar battery module 30b overlaps on the lower end of the α-type solar battery module 30a, and the second terminals 16 included in the ω-type solar battery module 30b are connected to the respective first terminals 15 included in the α-type solar battery module 30a. Further, the upper end of the α-type solar battery module 30a overlaps on the lower end of the ω-type solar battery module 30b, and the second terminals 16 included in the α-type solar battery module 30a are connected to the respective first terminals 15 included in the ω-type solar battery module 30b. Since each of the series-connected solar batteries 25 includes five solar battery cells 20a to 20e, the solar battery array 40 has twenty series-connected solar battery cells 20 arranged in twenty rows.

In the solar battery array 40 shown in FIG. 7A, all of the second terminals 16 of the uppermost α-type solar battery module 30a are electrically connected by a first bus bar 31a, and all of the first terminals 15 of the lowermost ω-type solar battery module 30b are electrically connected by a first bus bar 31b. Twenty series connections are connected in parallel by these first bus bars 31a and 31b.

In the solar battery array 40 shown in FIG. 8, the ten second terminals 16 on the left side of the uppermost α-type solar battery module 30a are electrically connected by the first bus bar 31a, and the ten second terminals 16 on the right side of the uppermost α-type solar battery module 30a are electrically connected by the first bus bar 31b. Further, the ten first terminals 15 on the left side of the lowermost ω-type solar battery module 30b are electrically connected by a first bus bar 31c, and the ten first terminals 15 on the right side of the lowermost ω-type solar battery module 30b are electrically connected by a first bus bar 31d. Thus, the ten series connections on the left side are connected in parallel by the first bus bars 31a and 31c, and the ten series connections on the right side are connected in parallel by the first bus bars 31b and 31d. Thus, changing the number of series connections that constitute the parallel connection can easily adjust the current according to the system requirement. In the solar battery modules 30a and 30b, a plurality of first terminals 15a to 15t arranged on the light reception face of the solar battery module are lined up in a row in the longitudinal direction of the solar battery module, and a plurality of second terminals 16a to 16t arranged on the back face of the solar battery module are lined up in a row in the longitudinal direction of the solar battery module. With the above configuration, the number of series-connected solar batteries 25 to be connected in parallel can be easily adjusted, a high voltage can be suppressed when the solar battery module is connected, and the current value can be increased. It is also easy to adjust the solar battery cell system to the required voltage and current of the IoT and mobile device, making it suitable as an independent power supply device.

Figure 9A:
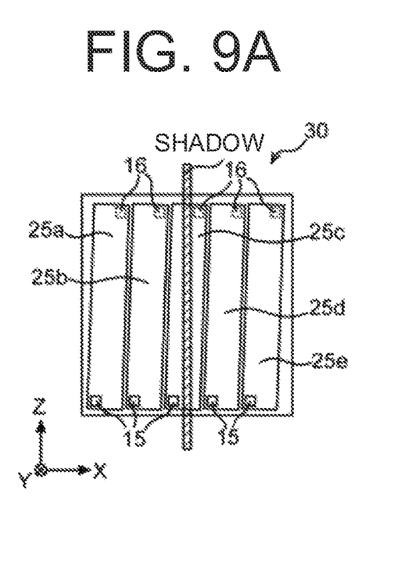
FIG. 9A is a schematic plan view of the solar battery module.
Figure 9B:
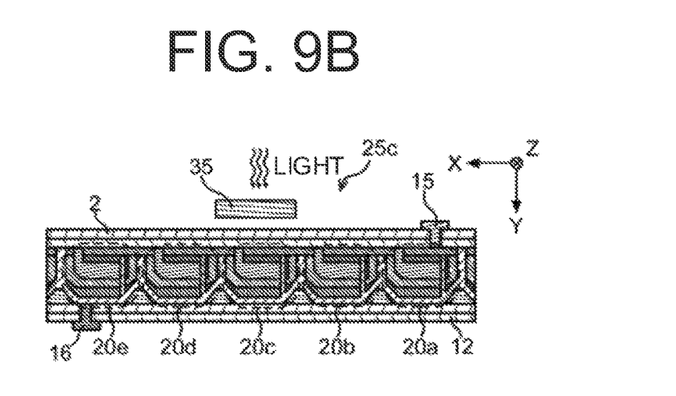
FIG. 9B is a schematic cross-sectional view of the series-connected solar battery.
Figure 9C:
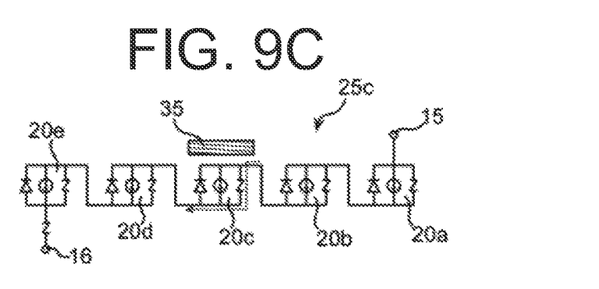
FIG. 9C is an equivalent circuit of the series-connected solar battery.

FIG. 9A to FIG. 9C show schematic diagrams illustrating the operation of current that bypasses when a shadow is caused to the solar battery module 30. As for the solar battery module 30, since the long and thin strips of solar battery cell 20a to 20e are integrated, even if the shadow is caused locally, the entire face of the solar battery cell 20 is hardly hidden, so that the power can be generated without interrupting the photo-excitation current in the middle. Further, even when the shadow is applied to the entire face of the solar battery cell 20 and the photo-excitation current is interrupted, the first barrier layer 9 which functions as a varistor bypasses the photo-excitation current from the unshadowed area to the adjacent solar battery cell 20, thereby making it possible to suppress the power generation from being reduced due to the shadow. Other configurations are the same as those in the first embodiment. Further, the description of the first embodiment also applies to the second embodiment as long as no contradiction is found.

Third Embodiment

Figure 10A:
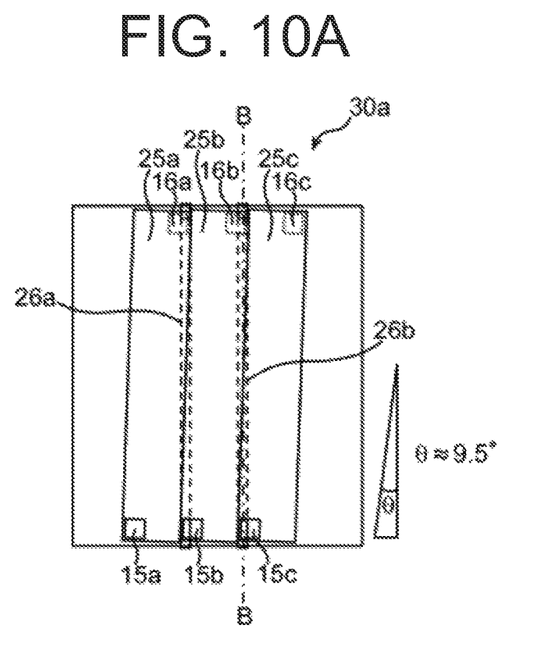
FIG. 10A is a partial plan view of the solar battery module.
Figure 10B:
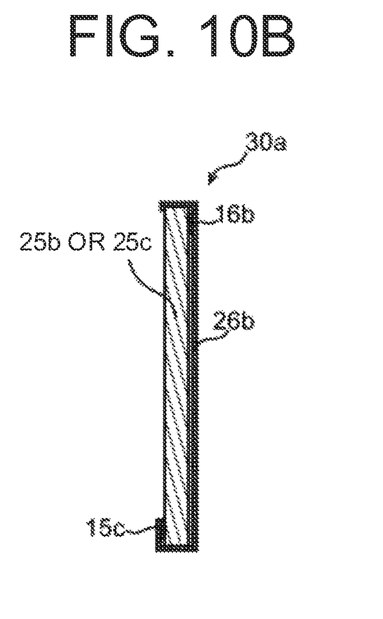
FIG. 10B is a schematic cross-sectional view of the solar battery module along a one-dot chain line B-B.
Figure 11A:
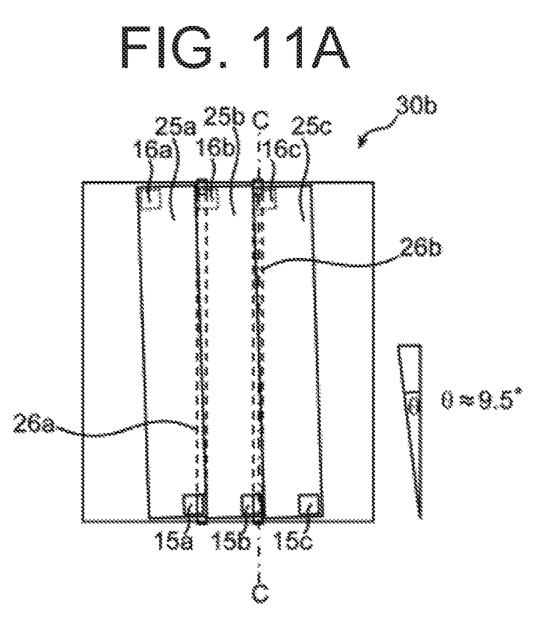
FIG. 11A is a partial plan view of the solar battery module.

FIG. 10A is a partial plan view of the α-type solar battery module 30a, and FIG. 10B is a schematic cross-sectional view of the solar battery module 30a along a one-dot chain line B-B. FIG. 11A is a partial plan view of the ω-type solar battery module 30b, and FIG. 11B is a schematic cross-sectional view of the solar battery module 30b along a one-dot chain line C-C.

In the present embodiment, the solar battery module 30 (30a, 30b) is a rectangle. Further, each of the series-connected solar batteries 25a to 25c included in the solar battery module 30 has an elongated shape. The shape of the series-connected solar battery 25 may be a rectangle or a parallelogram. The first terminals 15a to 15c are arranged on the light reception face and at one end of the elongated shape. The second terminals 16a to 16c are arranged on the back face and at the other end of the elongated shape. Further, the plurality of series-connected solar batteries 25a to 25c are arranged in parallel rows in a manner to be diagonal to one side of the rectangle. Further, the solar battery module 30 of the present embodiment is also provided with second bus bars 26 (26a, 26b). The second bus bar 26 electrically connects the two adjacent series-connected solar batteries 25 included in the plurality of series-connected solar batteries 25a to 25c.

Figure 11B:
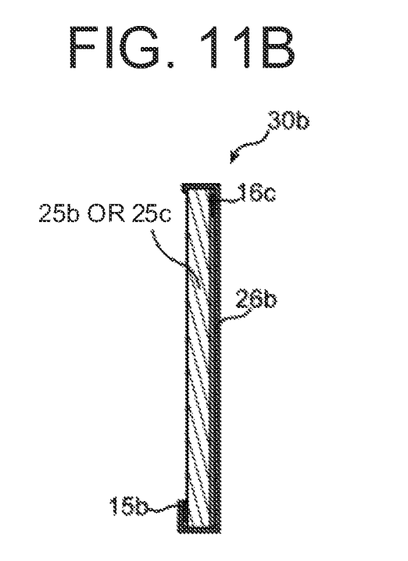
FIG. 11B is a schematic cross-sectional view of the solar battery module along a one-dot chain line C-C.

In the solar battery modules 30a and 30b shown in FIG. 10 and FIG. 11, the series-connected solar batteries 25a to 25c are formed at an angle (as an example, $\theta \approx 9.5°$) to the end of the solar battery modules 30a and 30b. This allows the first terminal 15 of one of the two adjacent series-connected solar batteries 25 and the second terminal 16 of the other series-connected solar battery 25 to be connected by means of the second bus bar 26 (26a, 26b) which is arranged parallel to one side of the rectangular solar battery module 30. With this, the two adjacent series-connected solar batteries 25 can be connected in series.

For example, as shown in FIG. 10B and FIG. 11B, the second bus bar 26b can have an elongated shape extending in a direction parallel to one side of the solar battery module 30, and is mainly arranged on the back face side of the solar battery module 30 and is in contact with the second terminal 16. Further, the second bus bar 26b has an end portion that bends like a hook to go around to the light reception face and contacts the first terminal 15. The second bus bar 26b as above allows the series connection of the series-connected solar battery 25b and the series-connected solar battery 25c. Further, the second bus bar 26 as above can be provided for each pair of two adjacent series-connected solar batteries 25.

A high-voltage sheet with a plurality of such second bus bars 26 provided on an organic film at equal intervals may be formed. The high-voltage sheet as above can be stretched together on the back face side of the solar battery module 30, and, by means of each second bus bar 26, the first terminal 15 of one of the two adjacent series-connected solar batteries 25 can be connected with the second terminal 16 of the other series-connected solar battery 25. This allows the series connection of the series-connected solar batteries 25 without the second bus bar 26 interfering, and a high-voltage solar battery module can be easily obtained. Further, since the α-type solar battery module 30a and the ω-type solar battery module 30b are mirror-image symmetrical, a high-voltage solar battery module can be obtained by using the same high-voltage sheet.

The film-type perovskite solar battery module can be provided as a key device of the independent power supply system for the mobile device including the IoT and electric vehicles.

While there have been described what are at present considered to be certain embodiments of the present invention, it will be understood that various modifications may be made thereto, and it is intended that the appended claims cover all such modifications as fall within the true spirit and scope of the present invention.

What is claimed is:

1. A solar battery cell, comprising:
   a substrate;
   a first electrode provided above the substrate;
   a photoelectric conversion layer provided on the first electrode;
   a second electrode provided on the photoelectric conversion layer; and
   a barrier layer so provided as to cover a side portion of the photoelectric conversion layer, wherein the photoelectric conversion layer has an electron transport layer, a light absorption layer provided on the electron transport layer, and a hole transport layer provided on the light absorption layer, the light absorption layer includes a compound having a perovskite crystal structure, and the barrier layer is a dense inorganic material layer, wherein the barrier layer contains zinc oxide with a content of 95 wt % or more as a base material and at least one of silicon oxide, aluminum oxide, and titanium oxide as an additive material, and wherein the barrier layer functions as a varistor element.

2. The solar battery cell according to claim 1,
wherein
the barrier layer connects with the first electrode and the second electrode such that the barrier layer and the photoelectric conversion layer are connected in parallel.

3. A solar battery, comprising:
a plurality of the solar battery cells according to claim 1;
a first terminal; and
a second terminal,
wherein the plurality of the solar battery cells are connected in series,
the solar battery cell at one end among the plurality of the solar battery cells is connected to the first terminal, and
the solar battery cell at another end is connected to the second terminal.

4. A solar battery module, comprising:
a plurality of the solar batteries according to claim 3,
wherein a plurality of the first terminals are arranged on a light reception face, and
a plurality of the second terminals are arranged on a back face on an opposite side of the light reception face.

5. The solar battery module according to claim 4,
wherein the solar battery module has a rectangular shape,
each of the plurality of the solar battery cells has an elongated shape,
each of the plurality of the first terminals is arranged at one end of the elongated shape,
each of the plurality of the second terminals is arranged at another end of the elongated shape, and
the plurality of the solar batteries are arranged in parallel rows in a manner to be diagonal to one side of the rectangular shape.

6. The solar battery module according to claim 4, further comprising a bus bar,
wherein the bus bar electrically connects two of the solar batteries in the plurality of the solar batteries that are adjacent to each other.

7. The solar battery module according to claim 4,
wherein the plurality of the first terminals included in the solar battery module are lined up in a row, and
the plurality of the second terminals included in the solar battery module are lined up in a row.

8. A solar battery array, comprising:
a plurality of the solar battery modules according to claim 4,
wherein the plurality of the solar battery modules include a first solar battery module, and a second solar battery module connected to the first solar battery module, and
the plurality of the first terminals and the plurality of the second terminals included in the first solar battery module are arranged at a position that is mirror-image symmetrical with a position of the plurality of the first terminals and the plurality of the second terminals included in the second solar battery module.

9. A solar battery, comprising:
a plurality of solar battery cells;
a first terminal; and
a second terminal,
wherein the plurality of the solar battery cells are connected in series,
the solar battery cell at one end among the plurality of the solar battery cells is connected to the first terminal, and
the solar battery cell at another end is connected to the second terminal,
each of the plurality of the solar battery cells comprises: a substrate; a first electrode provided above the substrate; a photoelectric conversion layer provided on the first electrode; a second electrode provided on the photoelectric conversion layer; and a barrier layer so provided as to cover a side portion of the photoelectric conversion layer,
the photoelectric conversion layer has an electron transport layer, a light absorption layer provided on the electron transport layer, and a hole transport layer provided on the light absorption layer,
the light absorption layer includes a compound having a perovskite crystal structure,
and the barrier layer is a dense inorganic material layer,
wherein the first electrode of one of the plurality of the solar battery cells is separated from the first electrode of each of the others of the plurality of the solar battery cells, and wherein the barrier layer functions as a varistor element.

* * * * *